(12) United States Patent
Schwilch et al.

(10) Patent No.: US 8,456,165 B2
(45) Date of Patent: Jun. 4, 2013

(54) DEVICE FOR HIGHLY PRECISE SYNCHRONIZATION OF THE NMR TRANSMISSION FREQUENCY TO THE RESONANCE FREQUENCY OF AN NMR LINE WHILE TAKING INTO CONSIDERATION A NON-CONSTANT RF PHASE

(75) Inventors: Arthur Schwilch, Uster (CH); Michael Schenkel, Baeretswil (CH)

(73) Assignee: Bruker BioSpin AG, Faellanden (CH)

( * ) Notice: Subject to any disclaimer, the term of this patent is extended or adjusted under 35 U.S.C. 154(b) by 542 days.

(21) Appl. No.: 12/662,388

(22) Filed: Apr. 14, 2010

(65) Prior Publication Data
US 2010/0271025 A1    Oct. 28, 2010

(30) Foreign Application Priority Data
Apr. 27, 2009    (DE) .......................... 10 2009 002 676

(51) Int. Cl.
*G01R 33/48*    (2006.01)
*G01V 3/00*    (2006.01)

(52) U.S. Cl.
USPC ........... 324/314; 324/307; 324/309; 324/322; 702/85

(58) Field of Classification Search
USPC ...................................... 324/300–322; 702/85
See application file for complete search history.

(56) References Cited

U.S. PATENT DOCUMENTS

| 3,502,964 A |   | 3/1970 | Freeman |
|---|---|---|---|
| 4,284,949 A |   | 8/1981 | Vidrine |
| 5,166,620 A | * | 11/1992 | Panosh .......................... 324/322 |
| 5,302,899 A | * | 4/1994 | Schett et al. .................. 324/318 |
| 2008/0027666 A1 | * | 1/2008 | Schenkel et al. ................. 702/85 |

FOREIGN PATENT DOCUMENTS

| JP | 61 256 244 | 11/1986 |
|---|---|---|
| JP | 03-156 394 | 7/1991 |
| JP | 2005 274 427 | 10/2005 |

* cited by examiner

*Primary Examiner* — Melissa Koval
*Assistant Examiner* — Emily Chan
(74) *Attorney, Agent, or Firm* — Paul Vincent

(57) ABSTRACT

A device has a first control loop (28) with which a frequency RF of an RF generator is synchronized with a resonance frequency F0 of an NMR line. A phase shifter (22) is provided to rotate the radio frequency phase of the NMR receiver system in the first control loop. The phase shifter is controlled by a second control loop (27) whose input signal comes from a signal extraction stage.

11 Claims, 3 Drawing Sheets

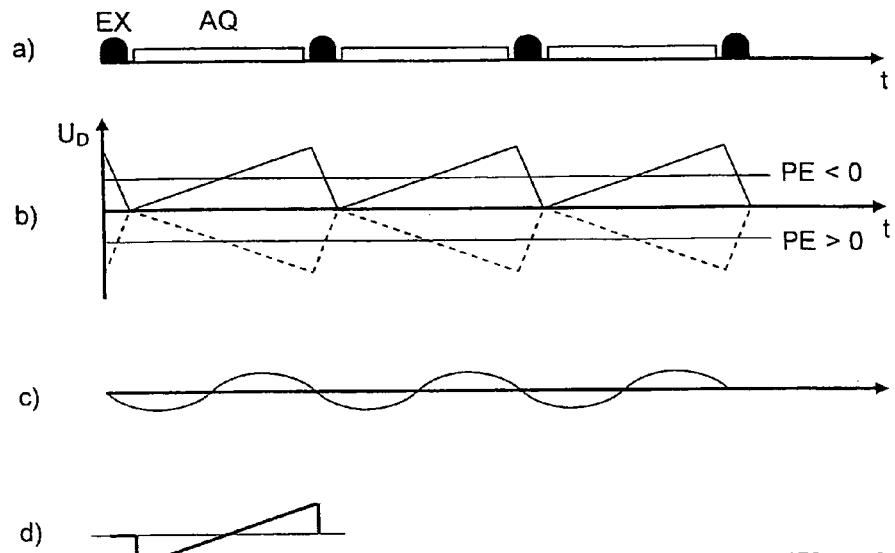
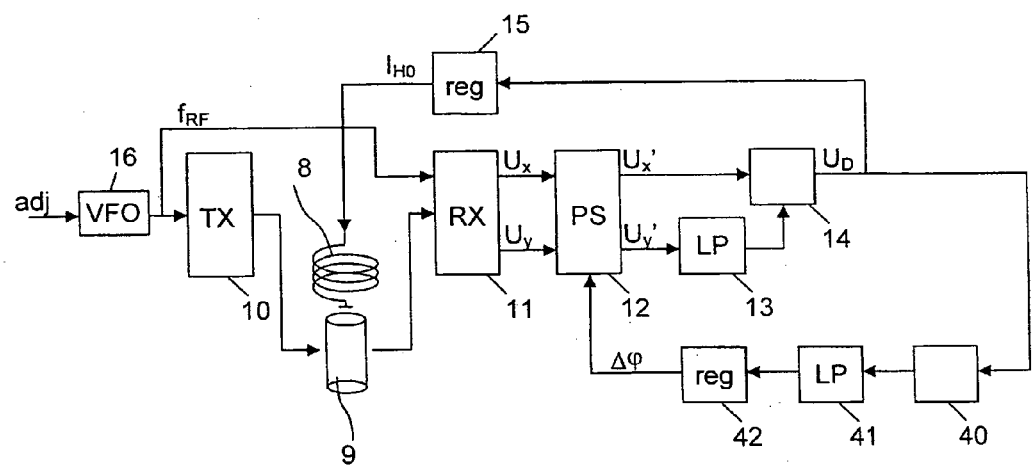
Fig. 3
Fig. 4

DEVICE FOR HIGHLY PRECISE SYNCHRONIZATION OF THE NMR TRANSMISSION FREQUENCY TO THE RESONANCE FREQUENCY OF AN NMR LINE WHILE TAKING INTO CONSIDERATION A NON-CONSTANT RF PHASE

This application claims Paris Convention priority of DE 10 2009 002 676.2 filed Apr. 27, 2009 the complete disclosure of which is hereby incorporated by reference.

BACKGROUND OF THE INVENTION

The invention relates to a device that comprises an RF generator, an NMR transmission and reception system, and a first control loop, with which the frequency of the RF generator is synchronized with the resonance frequency $f_0$ of an NMR line, wherein, from the signal of the RF generator, a train of excitation pulses of the repetition frequency $f_m$ is generated, with which nuclear spins of a certain resonance frequency of an associated NMR line are excited quasi-continuously (CW) and, in the times between the excitation pulses, the NMR signal is received, wherein the period time $1/f_m$ is chosen to be much smaller than the relaxation time of the NMR line, preferably shorter than ⅒ of the relaxation time, and the NMR signal $U_D$, mixed down into the low-frequency range, is used with the help of the first control loop, to closed-loop-control the value of the transmission frequency (=frequency lock) or the value of the $B_0$ field (=field lock) in such a way that the frequency and phase of the RF generator and the NMR line match as precisely as possible.

Such a device is known from U.S. Pat. No. 5,302,899 A (=Reference [1])

In nuclear magnetic resonance spectroscopy, it is decisive that all variables acting physically upon the sample be very precisely stabilized or at least measured and compensated for by means of calculation. These primarily include the magnetic field strength, but further variables, such as the temperature or pressure, can also have a great influence on the nuclear magnetic resonance spectrum and adversely affect its information content.

The field lock according to reference [1] has become established for the stabilization of the magnetic field.

Herein, the magnetic field strength is corrected by a closed-loop controller acting on a compensation coil in such a way that a marker substance (typically $D_2O$) that is excited by a specialized radio-frequency channel with rapidly alternating transmission and reception remains in resonance.

The limited precision of this field stabilization is known but is normally obscured by other instabilities, in particular, fluctuations of the sample temperature. These originate primarily from small temperature-dependent phase shifts in the radio-frequency path (transmitter, cable, probe head, filter, receiver) of the field lock and can be improved for a short time by manual adjustment of the lock phase.

The sample temperature is typically stabilized by an air or nitrogen gas flow that passes over the sample and stabilizes its temperature with a sensor element (thermocouple, PT100, or the like).

The gas flow at the sensor element is stabilized with a precision better than 0.1K, but the sample temperature may deviate from the sensor temperature by several Kelvin due to various heat inputs into the gas flow after the sensor or directly into the sample.

By the terms "NMR thermometer" or "chemical shift thermometer," numerous marker substances are known that are either mixed into the sample or entered separately into the magnets in a two-chamber sample vessel. The sample temperature can be measured with a precision of approx. 0.1K by evaluating the different temperature-dependent shifts of two resonance lines in the spectrum of the marker substance.

The marker substance is typically sensed with the NMR measurement channel, which prohibits simultaneous sensing of the marker substance and the analysis substance. This is a problem, in particular, in decoupling experiments, in which the sample can be heated by several Kelvin by the radio-frequency power used in the experiment.

As early as 1967, Freeman suggested (see reference [2]) exciting two resonance lines simultaneously by means of a field modulation with a fixed transmission frequency and to vary the frequency of the field modulation continuously in such a way that both lines remain in resonance. The frequency of the field modulation is then a measure of the sample temperature and can be deployed to control the temperature of the gas flow around the sample.

Reference [3] suggests detecting the resonance line of the temperature marker in addition to the field lock using an NMR oscillator. For this purpose, self-oscillation is triggered by selective amplification between the reception and the transmission coil and the differential frequency from the field lock is input to a frequency counter as a measure of the sample temperature.

In reference [4], Keiichiro extracts the differential frequency between the field lock and temperature marker NMR frequency from the output signal of the field lock receiver and closed-loop-controls the sample temperature in such a way that this frequency matches a reference frequency that the sample temperature defines.

SUMMARY OF THE INVENTION

The inventive device relates to an NMR transmission and reception system with a device for synchronizing the NMR transmission frequency with the resonance frequency of an NMR line, wherein rapidly alternating transmission and reception is used and a closed-loop control sets either the value of the transmission frequency (=frequency lock) or the value of the $B_0$ field (=field lock) in such a way that the frequency and phase of the RF generator and the NMR line match as precisely as possible.

The object of this invention is to take the influence of the RF phase on synchronization into consideration in order to improve the precision with which synchronization to the resonance frequency of an NMR line is performed.

This object is achieved in a surprisingly simple and effective way, whereby a phase shifter that rotates the radio-frequency phase of the NMR transmission and reception system in the first control loop by the value $\Delta\phi$ is controlled by a second control loop whose input signal comes from a signal extraction stage that extracts the saw-tooth AC component of the signal $U_D$ and maintains this input signal at zero by closed-loop control. A phase shifter is incorporated into the NMR transmission/reception system that acts as a final controlling element of a second control loop, and its phase $\Delta\phi$ is changed in such a way that the saw-tooth AC component of the unfiltered signal mixture from the dispersion channel is used as the measured quantity of the second control loop and is maintained at zero by closed-loop control.

This improvement results both in more precise synchronization in the frequency or field lock (e.g. with deuterium as the marker substance) and in increased precision of the NMR temperature measurement, wherein the difference between the resonance frequencies of two NMR lines with different temperature coefficients is used to determine the temperature value of the measurement sample (=NMR thermometer). The new, continuously functioning NMR thermometer provides clearly improved precision compared with conventional temperature sensors that can only measure the temperature of the gas flow with which the measurement sample is heated or cooled.

Further advantages of the invention can be extracted from the description and the drawing. In accordance with the invention, the characteristics stated above and further below can be used individually or in any combination. The embodiments shown and described are not intended to be an exhaustive list but are examples used to illustrate the invention.

The invention is represented in the figure and is explained in more detail with the help of embodiments.

BRIEF DESCRIPTION OF THE DRAWING

FIG. 3a RF signals in the NMR lock with a transmission phase EX and a reception phase AQ;

FIG. 3b Phase modulation due to a phase error PE in the control loop;

FIG. 3c Sinusoidal oscillation for extraction of the phase modulation;

FIG. 3d Exemplary shape of the matched filter signal;

FIG. 4 Field lock with phase error compensation control loop; and

DESCRIPTION OF THE PREFERRED EMBODIMENT

Figure 1:
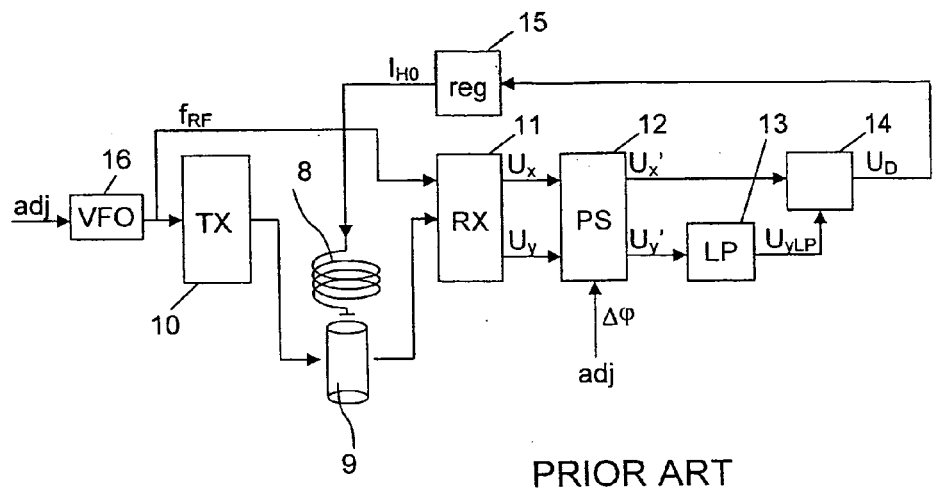
FIG. 1 Field lock according to the prior art.

FIG. 1 shows a field lock according to prior art:

In rapid succession, the emission of a fixed excitation frequency ($f_{RF}$) from a radio-frequency generator (29) by the transmitter (10) alternates with the reception of the NMR signal in the quadrature receiver (11). The lock phase can be statically set with the phase shifter (12). Division of the dispersion signal by the low-pass filtered (13) absorption signal ($U_x/U_{yLP}$) in the scaling stage (14) causes the closed-loop controller (15) to stabilize the magnetic field of the sample (9) due to the current ($I_{HO}$) in the compensation coil (8), substantially independently of the signal level of the receiver (11).

Figure 2:
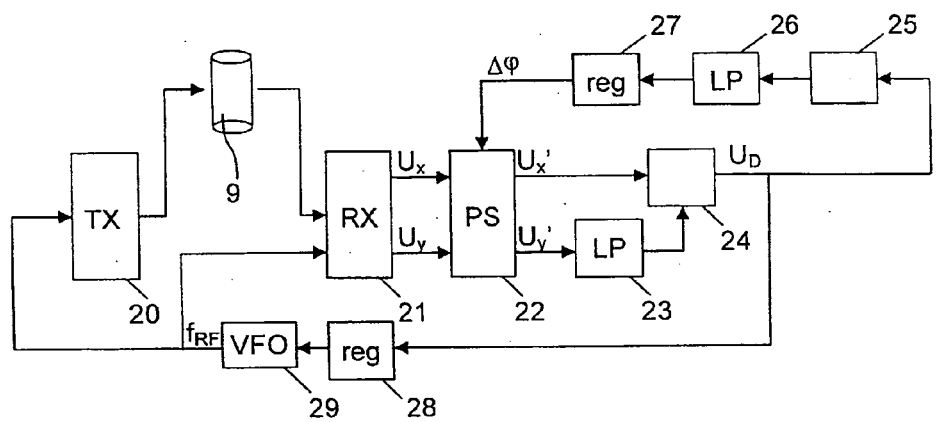
FIG. 2 Frequency lock with a phase error compensation control loop.

FIG. 2 shows a frequency lock with a phase error compensation control loop:

In rapid succession, the emission of a variable excitation frequency ($f_{RF}$) from a radio-frequency generator (29) by the transmitter (20) alternates with the reception of the NMR signal in the quadrature receiver (21) on the same frequency ($f_{RF}$). In the phase shifter (22), the phase is continuously closed-loop-controlled in such a way that the saw-tooth AC component of the signal mixture from the dispersion channel ($U_D$) acts as the measured quantity of the second controller (27) and is maintained at zero by closed-loop control. Division of the dispersion signal by the low-pass filtered (23) absorption signal ($U_x/U_{yLP}$) in the scaling stage (24) causes the closed-loop controller (28) to match the transmission frequency ($f_{RF}$) to the resonance of an NMR line substantially independently of the signal level of the receiver (21). Extraction of the saw-tooth AC component is optimally performed with a matched filter (25) with a downstream low-pass filter (26).

FIG. 3a shows the time dependence of a time-sharing method of the NMR lock with transmission phase EX and reception phase AQ. The period is 150 µs and is therefore many times shorter than the relaxation time of the marker substance.

FIG. 3b shows the time dependence of the phase modulation due to a phase error in the control loop. The excitation frequency is set in such a way that the averaged phase offset compensates for the phase error (PE).

FIG. 3c shows the time dependence of a sinusoidal oscillation for detection (extraction) of the phase modulation.

FIG. 3d shows an exemplary shape of the matched filter signal for extraction of the phase modulation in time.

FIG. 4 shows a field lock with an inventive phase error compensation control loop similar to that of FIG. 2.

Figure 5:
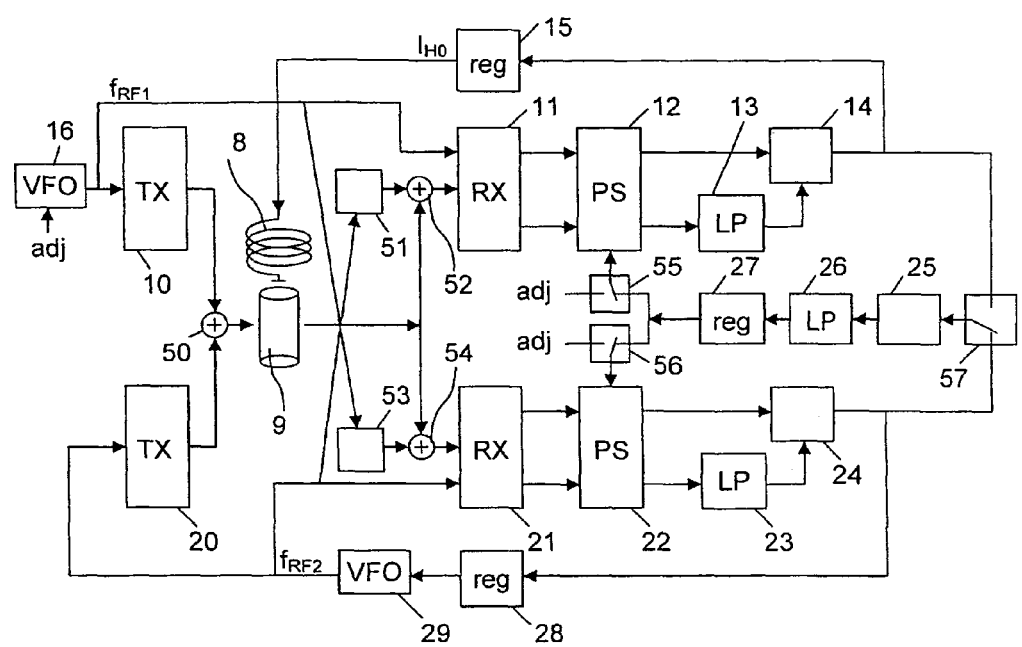
FIG. 5 NMR thermometer combining a field lock and a frequency lock

FIG. 5 shows a combination of a field lock (FIG. 4) and a frequency lock (FIG. 2), wherein the field lock NMR resonance also acts as one of the two NMR resonance lines for the temperature measurement. The two transmitter signals are added in an adder (50) and the reception signal is distributed to both receivers. Disturbance feedforward control of the non-sampled transmitter signal by means of a coupling device from the RF generator (16, 29) of the one channel to the receiver (21, 11) of the other channel (52, 54) with settable amplitude and phase (51, 53) ensures good suppression of the adjacent channel. The phase error compensation closed-loop controller is designed for both channels together and closed-loop-controls (57) the channel that provides the better signal-to-noise ratio. The phase compensation of the other channel is controlled identically. Each channel can be switched over to a statically configured phase (55, 56).

Fast, continuous, and highly precise measurement of the resonance frequency of a marker substance facilitates, or enables, the stabilization of a physical quantity that influences the NMR spectrum at the location at which the NMR measurement is performed, that is, in the sample.

The NMR field lock known, for example, from [1] is inventively augmented by compensation of the radio-frequency phase drift. Moreover, the principle is also augmented to the synchronization of a variable transmission frequency to the fixed resonance frequency of an NMR line.

Because the saw-tooth AC component of the signal $U_D$ is typically much smaller than the noise, noise-optimal signal extraction is preferably used. Precisely this is achieved with a matched filter, which multiplies the signal by a weighting function (FIG. 3d) that exhibits the normalized, characteristic time dependence of the signal.

All components of an NMR radio-frequency system, such as the transmitter, cable, probe head, filter, or receiver, exhibit unwanted temperature-dependent phase rotation. The greatest component of this typically occurs in the resonance circuit of the probe head.

For the normal, pulsed FT-NMR, this phase rotation is only of minor importance because each spectrum acquired is normally phase-compensated before evaluation.

However, if an NMR line is held permanently in resonance by a closed-loop control circuit (CW), it is no longer possible to determine the temperature-dependent phase rotation by analysis of the spectrum.

It is irrelevant how the NMR line is kept in resonance: whether by self-oscillation due to damping reduction (see [3]), continuous over time (see [2, 4]), or pulsed (see [1]) transmission / reception, the resonance frequency always shifts depending on the phase error and line width.

This is where the design of the NMR resonance detector according to reference [1] is relevant. This works by a fast (e.g. 6 kHz) time-sharing method (FIG. 3a) in such a way that a low-humped shaped, selective excitation pulse and a measurement phase are interwoven in time. The switching between excitation and reception is performed many times faster than the relaxation time of the marker substance.

For the field lock (FIG. 1) known from reference [1], only the DC component of the dispersion signal UD is passed from the receiver (11) after scaling (14) through the low-pass-filtered (13) absorption signal ($U_x/U_{yLP}$) into the closed-loop controller (15) that stabilizes the magnetic field of the sample (9) by the current ($I_{H0}$) in the compensation coil (8).

If there is a phase error in the control loop (15), the control loop attempts to compensate for this phase error by a small shift in the excitation frequency. The frequency of the NMR resonance in the transmission pauses is not affected by this, but the phase of the NMR resonance is almost completely synchronized to the phase of the excitation frequency by each excitation pulse. During the measurement phase, a phase difference then accumulates with the rate of the differential frequency. This results in saw-tooth phase modulation of the reception signal ($U_D$, FIG. 1-3). Averaged over the entire measurement time, this compensates for the phase error.

The phase modulation is minuscule and depends on the ratio of the repetition frequency of the excitation pulse train to the line width or on the ratio of the relaxation time to the time interval of the excitation pulses, which, by definition of a line kept permanently in resonance, must be large, in particular, >10. If, however, thousands of individual modulation cycles are evaluated, the drifting phase rotation can be determined and compensated for.

It is surprising that the method works considering the common explanation for the continuous, pulsed excitation of an NMR line: the spectrum of a transmission pulse train consists of a fundamental frequency and spurious components at separations of the pulse repetition frequency $f_m$. Because $f_m$ is much larger than the line width should be, it is often assumed that only the fundamental frequency affects the NMR line. However, the fundamental frequency is mathematically and physically permanently present (not pulsed).

This dilemma is only solved with the knowledge that the spurious components make a (permanent) contribution to excitation of the NMR line, despite their separation from the NMR line.

Now because it is possible to measure NMR lines kept constantly in resonance without any great influence of the phase rotation in the radio-frequency path, a synchronization system becomes possible that in addition to the inventive device A comprises a further device B, wherein an NMR measurement substance is used with at least two NMR lines with the resonance frequencies $f_{01}$ and $f_{02}$ with different temperature coefficients, wherein the device A is synchronized selectively to $f_{01}$ and the device B selectively to $f_{02}$, and wherein the differential frequency ($f_{02}-f_{01}$) is measured to determine the temperature value of the NMR measurement sample and to designate it as the temperature value of an NMR thermometer.

With an added temperature closed-loop control, the result is a synchronization system that inputs the instantaneous temperature value of the NMR thermometer to a temperature closed-loop controller TR1, which heats or cools the temperature of a heating or cooling medium passing over the measurement sample such that the measurement sample reaches and remains at the defined temperature value.

Though proposed for a very long time, for example, in references [2] to [4], the NMR thermometer was never accepted for stabilization of the sample temperature, although the temperature is probably the largest source of error for NMR after the magnetic field strength.

This was presumably due to the achievable precision of the continuous NMR sample temperature measurement with common, affordable, non-toxic marker substances that do not disturb the NMR measurement.

The resonance of an ideal marker substance is in the frequency band of the field lock, that is, typically, of deuterium, where it does not require additional transmission/reception hardware and does not disturb the NMR experiment. $D_2O/CD_3OD$ or $D_2O/H_2^{17}O$ are very suitable for example. In this way, both resonance frequencies can be processed by the same radio-frequency electronics. However, the difference between the temperature coefficients of these pairs of substances is below 1 Hz/K for a 500 MHz magnet.

The line widths of the preferred marker substances are in the range 0.5 Hz ($CD_3OD$) to 3.8 Hz ($D_2O$).

If, according to the prior art or trivial variations thereof, two temperature marker lines are now excited continuously and their resonance is measured, the unavoidable, minor temperature-dependent phase rotation (PE) in the radio-frequency path (transmitter, cable, sample head, filter, receiver) will cause a shift of the measured frequency ($f_m$) that depends on the resonance line width as follows:

$$fm = \tan(PE)*HW/2 \text{(full width half maximum } HW,\text{ phase rotation } PE)$$

In the case of different widths of the two temperature marker lines, a measurement error of the sample temperature arises. This is, for example, for a typical phase rotation of 20° and $D_2O/CD_3OD$ approximately 0.75K.

If the NMR resonance lines were excited by frequencies that are continuous over time as proposed in references [2] and [3], closed-loop-controlled compensation of the phase error would not be possible and the system would, for many marker substances, in particular, the preferred substances containing deuterium, have a measurement precision that is scarcely above that of conventional gas flow temperature control.

In a system that simultaneously stabilizes the NMR frequency $f_0$ (field lock) and measures or stabilizes the temperature of the measurement sample, the field lock NMR resonance is preferably used simultaneously as one of the two NMR resonance lines for temperature measurement (FIG. 5).

The phase error compensation control loop can be applied in the field lock control loop (FIG. 4) and/or in the frequency lock control loop (FIG. 2). It is preferably used in the control loop having the stronger signal (see FIG. 5, selector switch 57). Provided that identical radio-frequency hardware is used for both substances, one phase error compensation control loop is enough because both signals contain the same error. The phase correction is then applied identically to both loops (see FIG. 5, selector switch 55, 56).

If one of the two NMR resonance lines for temperature measurement is also used as a field lock (FIG. 5) and the second NMR resonance line is very close to the field lock resonance line, the closed-loop control bandwidth of the field lock can extend into the range of the temperature resonance line. Especially for this case, the NMR thermometer is supplemented by a device, characterized in that a coupling device is provided that routes the signal of the RF generator (29, 16) of the device A through an amplitude and phase correction (51, 53) and combines it with the RF reception signal of the device B in an adder in such a way (52, 54) that the unwanted resonance line $f_{01}$ there is suppressed as well as possible.

Similarly to the field lock, the NMR thermometer responds with total failure to gradient pulses for the NMR measurement channel. For that reason, a control input is provided that freezes all closed-loop controller signals and state variables within all control loops.

The control loops are deactivated just ahead of the gradient pulses and re-activated after the last gradient pulse after a certain waiting time.

An improved synchronization system is characterized in that the temperature closed-loop controller TR1 is not frozen and that a computation unit calculates the input value for TR1 from the frozen NMR temperature value and from a combination of measurement values of additional, conventional temperature sensors that measure the temperature of the heating or cooling medium.

A further variation is characterized in that a control loop combines the measurement value of the NMR thermometer with the measurement values of additional conventional temperature sensors that measure the temperature of the heating or cooling medium in such a way that the measurement sample reaches the desired temperature faster.

As stated above, the sample temperature can deviate by several Kelvin from the gas flow temperature. However, if both temperatures are permanently available, the gas flow can be brought to a controlled overshoot value by closed-loop control so that a measurement sample freshly introduced into the magnets reaches the target temperature more quickly.

A further embodiment of the invention is a synchronization system in which the instantaneous temperature value of the NMR thermometer is input to a closed-loop controller whose output signal controls the power of an RF transmitter acting on the NMR sample in such a way that the measurement sample reaches and remains at the defined temperature value.

In this case, considerably faster and more homogeneous heating of the measurement sample can be expected than indirect heating via a heating medium and the outside wall of the measurement sample. This requires direct temperature measurement in the measurement sample.

List of Reference Symbols
10, 20 Radio-frequency transmitter
11, 21 Quadrature radio-frequency receiver
16, 29 RF generator
9 NMR sample
8 Compensation coil for the H0 field
12, 22 Phase shifter
13, 23, 26 Low-pass filter
14, 24 Scaling (division $U_x/U_{yLP}$)
25, 40 Matched filter
51, 53 Amplitude and phase rotation final controlling element
15, 27, 28, 42 Closed-loop controller
50, 52, 54 Adder
55, 56, 57 Selector switch
AQ Measurement time
EX Excitation pulse
PE Phase error
adj Manual manipulated variable
List of References
[1] U.S. Pat. No. 5,302,899 A
[2] U.S. Pat. No. 3,502,964 A
[3] DE 30 06 148 A1
[4] JP 3-156394 A

We claim:

1. A device for highly precise synchronization of an NMR transmission frequency to a resonance frequency of an NMR line while taking into consideration a non-constant RF phase, the device comprising:

an RF generator having a frequency $f_{RF}$;
an NMR transmission and reception system, said NMR transmission and reception system using an RF signal from said generator to produce a train of excitation pulses having a repetition frequency $f_m$ with which nuclear spins of a certain resonance frequency of an associated NMR line are excited quasi-continuously, wherein, in times between said excitation pulses, an NMR signal is received, a period time $1/f_m$ being chosen to be much smaller than a relaxation time of the NMR line or to be shorter than $1/10$ of said relaxation time;

a first control loop, said first control loop synchronizing said frequency $f_{RF}$ of said RF generator with a resonance frequency $f_0$ of the NMR line, wherein said first control loop utilizes an NMR signal $U_D$ mixed down into a low-frequency range to closed-loop-control and frequency lock a value of transmission frequency or to field lock a value of the $B_0$ field in such a way that a frequency and phase of said RF generator and the NMR line are matched; and a second control loop, said second control loop having a phase shifter that rotates a radio-frequency phase of said NMR transmission and reception system in said first control loop by a value $\Delta\phi$, said phase shifter being controlled in said second control loop via an input signal produced by a signal extraction stage, said signal extraction stage extracting a saw-tooth AC component of the signal $U_D$, wherein said second control loop maintains that input signal at zero via closed-loop control.

2. The device of claim 1, wherein said signal extraction stage is a matched filter.

3. The device of claim 1, wherein said first and second control loops are structured for interruption of said closed-loop control in response to input from an external interfering system.

4. A synchronization system having a first and second device, each of said first and said second devices comprising the elements recited in the device of claim 1, wherein an NMR measurement sample is used with at least two NMR lines with resonance frequencies $f_{01}$ and $f_{02}$ and with different temperature coefficients, wherein the first device is synchronized selectively to $f_{01}$ and the second device selectively to $f_{02}$, wherein a differential frequency $(f_{02} - f_{01})$ is measured to determine a temperature value of the NMR measurement sample and to designate it as the temperature value of an NMR thermometer.

5. The synchronization system of claim 4, wherein the first device does not have said second control loop for setting said phase $\Delta\phi$, a control variable of the second device also being applied to said phase shifter of said first device.

6. The synchronization system of claim 4, wherein a coupling device is provided that routes said signal of said RF generator of the first device through an amplitude and phase correction and combines it with an RF reception signal of the second device in an adder in such a way that an unwanted resonance line $f_{01}$ is suppressed.

7. The synchronization system of claim 6, wherein a further coupling device is provided from the second device to the first device to suppresses an unwanted resonance line $f_{02}$ in the first device.

8. The synchronization system of claim 4, wherein the synchronization system inputs an instantaneous temperature value of the NMR thermometer to a temperature closed-loop controller TR1, which heats or cools a temperature of a heating or cooling medium passing over the measurement sample such that the measurement sample reaches and remains at a defined temperature value.

9. The synchronization system of claim 8, wherein a control loop combines the measurement value of the NMR thermometer with the measurement values of additional, conventional temperature sensors that measure a temperature of the heating or cooling medium in such a way that the measurement sample reaches the desired temperature more quickly.

10. The synchronization system of claim 8, wherein a control input is provided that freezes all closed-loop controller signals and state variables within all control loops, wherein a temperature closed-loop controller TR1 is not frozen and a computation unit calculates an input value for said temperature closed-loop controller TR1 from a frozen NMR temperature value and from a combination of measurement values of additional, conventional temperature sensors that measure the temperature of the heating or cooling medium.

11. The synchronization system of claim 4, wherein an instantaneous temperature value of the NMR thermometer is input to a closed-loop controller whose output signal controls a power of an RF transmitter acting on the NMR sample in such a way that the measurement sample reaches and remains at a defined temperature value.

\* \* \* \* \*